US009507188B2

(12) United States Patent
Qin et al.

(10) Patent No.: US 9,507,188 B2
(45) Date of Patent: Nov. 29, 2016

(54) PEEP PREVENTION DISPLAY

(71) Applicant: BOE Technology Group Co., Ltd., Beijing (CN)

(72) Inventors: Wei Qin, Beijing (CN); Jing Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 136 days.

(21) Appl. No.: 14/413,928

(22) PCT Filed: May 26, 2014

(86) PCT No.: PCT/CN2014/078457
§ 371 (c)(1),
(2) Date: Jan. 9, 2015

(87) PCT Pub. No.: WO2015/109705
PCT Pub. Date: Jul. 30, 2015

(65) Prior Publication Data
US 2016/0282650 A1 Sep. 29, 2016

(30) Foreign Application Priority Data

Jan. 23, 2014 (CN) .......................... 2014 1 0032401

(51) Int. Cl.
H01L 27/15 (2006.01)
G02F 1/133 (2006.01)
(Continued)

(52) U.S. Cl.
CPC ... *G02F 1/13306* (2013.01); *H01L 31/022408* (2013.01); *H01L 31/165* (2013.01); *G02F 2001/13324* (2013.01)

(58) Field of Classification Search
CPC .................. G01F 1/13306; H01L 31/022408; H01L 31/165; H01L 27/3248; H01L 27/3276; G02F 2001/13324
See application file for complete search history.

(56) References Cited

U.S. PATENT DOCUMENTS 9,058,782 B2 *  6/2015  Fan ...................... G09G 3/3607
2008/0273148 A1 * 11/2008  Yoon ................. G02F 1/133512
                                                                    349/110

(Continued)

FOREIGN PATENT DOCUMENTS

CN       201301284 Y      9/2009
CN       101604033 A      12/2009

(Continued)

OTHER PUBLICATIONS

Nov. 25, 2015 (CN) First Office Action App 201410032401.5 with Eng Tran.

(Continued)

*Primary Examiner* — Yosef Gebreyesus
(74) *Attorney, Agent, or Firm* — Banner & Witcoff, Ltd.

(57) ABSTRACT

Provided is a peep prevention display, wherein a peep prevention film layer is provided on the light exit side of the peep prevention display, and the peep prevention film layer has a mesh structure; meshes of the mesh structure are arranged corresponding to sub-pixel units or pixel units of the display, and the peep prevention film layer comprises a P electrode lead layer, a P type semiconductor layer, an N type semiconductor layer and an N electrode lead layer. Since the peep prevention display has a small display angle of view, it can prevent peep by a person from side angle of view while providing image display for a user viewing from the front, so as to effectively protect personal privacy and business secret. In addition, the light blocked by a peep prevention film layer can be converted to electric energy, thus achieving an effect of self electricity generation.

6 Claims, 2 Drawing Sheets

(51) Int. Cl.
  *H01L 31/16* (2006.01)
  *H01L 31/0224* (2006.01)

(56) References Cited

U.S. PATENT DOCUMENTS

| | | | | |
|---|---|---|---|---|
| 2009/0153783 | A1* | 6/2009 | Umemoto | G02B 27/28 |
| | | | | 349/96 |
| 2010/0265435 | A1 | 10/2010 | Hwang et al. | |
| 2012/0299982 | A1* | 11/2012 | Inada | G09G 3/2074 |
| | | | | 345/690 |

FOREIGN PATENT DOCUMENTS

| | | |
|---|---|---|
| CN | 201421591 Y | 3/2010 |
| CN | 201465121 U | 5/2010 |
| CN | 202592871 U | 12/2012 |
| CN | 203299709 U | 11/2013 |
| JP | 2007155784 A | 6/2007 |

OTHER PUBLICATIONS

Mar. 4, 2016 (CN) Notice of Allowance App 201410032401.5 with Eng Tran.
International Search Report and Written Opinion mailed Oct. 14, 2014 (PCT/CN2014/078457); ISA/CN.
Jul. 26, 2016—International Preliminary Report on Patentability Appn PCT/CN2014/078457.

* cited by examiner

PEEP PREVENTION DISPLAY

The application is a U.S. National Phase Entry of International Application No. PCT/CN2014/078457 filed on May 26, 2014, designating the United States of America and claiming priority to Chinese Patent Application No. 201410032401.5 filed on Jan. 23, 2014. The present application claims priority to and the benefit of the above-identified applications and the above-identified applications are incorporated by reference herein in their entirety.

TECHNICAL FIELD OF THE DISCLOSURE

The present disclosure relates to a peep prevention display.

BACKGROUND

With development of the society and improvement of the material condition, various electronic devices such as cell phones, computers, TV and so on become popular in people's work and life. However, while the electronic devices provide convenience to the people, the issue of personal information leakage may arise. For example, taking display devices as known as examples, the known display devices typically have a large visible angle of view, which is a significant advantage for public display, but it is adverse to security of personal information.

SUMMARY

Embodiments of the present disclosure provide a peep prevention display which has a small display angle of view. The peep prevention display can prevent peep by a person from side angle of view while providing image display for a user viewing from the front, so as to effectively protect personal privacy and business secret. In addition, the light blocked by a peep prevention film layer can be converted to electric energy, thus achieving an effect of self electricity generation.

Embodiments of the present disclosure adopt the following technical solutions.

There is provided a peep prevention display, wherein a peep prevention film layer is provided on the light exit side of the peep prevention display, and the peep prevention film layer comprises a P electrode lead layer, a P type semiconductor layer, an N type semiconductor layer and an N electrode lead layer.

Optionally, meshes of a mesh structure formed in the peep prevention film layer are arranged corresponding to sub-pixel units or pixel units of the peep prevention display one to one.

Optionally, the meshes of the mesh structure has a shape of any one of rectangle, square, circle, hexagon, and the maximum size of the meshes of the mesh structure is not larger than 100 μm.

Optionally, the thickness of the P type semiconductor layer and thickness of the N type semiconductor layer are 1 μm~10 μm.

Optionally, the thickness of the P electrode lead layer and the thickness of the N electrode lead layer are not larger than 5 μm, and the material of the P electrode lead layer and the material of the N electrode lead layer are any one or several of Aluminum, Copper and Molybdenum.

Optionally, a protection glass is provided at the light exit side of the peep prevention film layer of the peep prevention display.

In the peep prevention display provided by an embodiment of the present disclosure, a peep prevention film layer is provided on the light exit side of the peep prevention display, the peep prevention film layer has a mesh structure, and the meshes of the mesh structure are arranged corresponding to the sub-pixel units or the pixel units of the display. The peep prevention film layer is configured to block the light so as to achieving the effect of controlling the display angle of view. On the other hand, the peep prevention film layer comprises a P electrode lead layer, a P type semiconductor layer, an N type semiconductor layer and an N electrode lead layer. The peep prevention film layer converts the blocked light into electric energy and outputs the same while blocking the light, thus achieving the effect of self electricity generation.

BRIEF DESCRIPTION OF THE DRAWINGS

In order to explain the known solutions or embodiments of the present disclosure more clearly, in the following, the drawings required in the description of the known solutions or the embodiments will be briefly introduced. Obviously, the drawings in the following description only illustrate some embodiments of the present disclosure. For those skilled in the art, other drawings can be obtained based on these drawings without creative work.

DETAILED DESCRIPTION

Embodiments of the present disclosure provide a peep prevention display which has a small display angle of view. The peep prevention display can prevent a peep from side angle of view while providing image display for a user viewing from the front, so as to effectively protect personal privacy and business secret. In addition, the light blocked by a peep prevention film layer can be converted to electric energy, achieving an effect of self electricity generation.

In the following description, for illustration but limitation, specific details such as specific system structures, interfaces and technologies are provided for completely understanding the embodiments of the present invention. However, those skilled in the art should understand other embodiments without those specific details can also implement the present invention. In other cases, detailed description of well-known apparatuses, circuits and processes is omitted to avoid unnecessary details disturbing the description of the embodiments of the present invention.

Detailed description will be made to embodiments of the present disclosure in connection with the figures.

Figure 1:
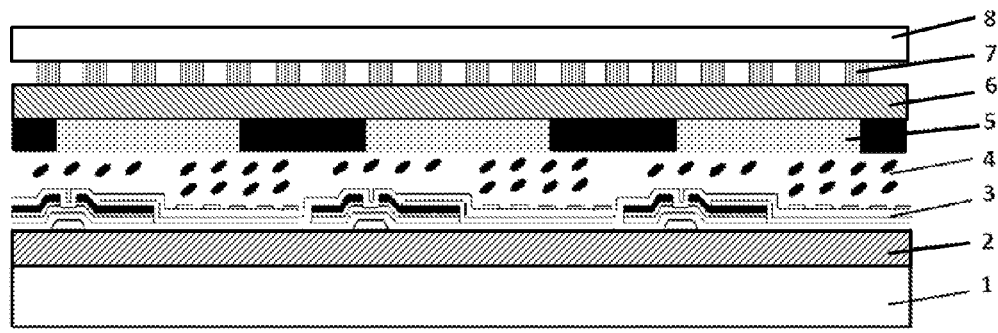
FIG. 1 is a schematic cross-sectional view of a peep prevention display provided by an embodiment of the disclosure.

As shown in FIG. 1, FIG. 1 is a schematic cross-sectional view of a peep prevention display provided by an embodiment of the present disclosure, wherein a peep prevention film layer 7 is arranged on the light exit side of the peep prevention display. Optionally, a protection glass 8 can be further arranged on the light exit side of the peep prevention film layer 7.

It is noted that, the peep prevention display as shown in FIG. 1 can also comprise structural units required by a display such as a backlight source 1, a glass substrate 2 for an array substrate, respective array layers in the array substrate, a liquid crystal layer 4, a color filter layer 5, a glass substrate 6 for the color filter substrate and so on. However, as known by those skilled in the art, the above structural units are not considered as further limitation to the peep prevention display provided by the embodiment of the present disclosure.

Figure 2:
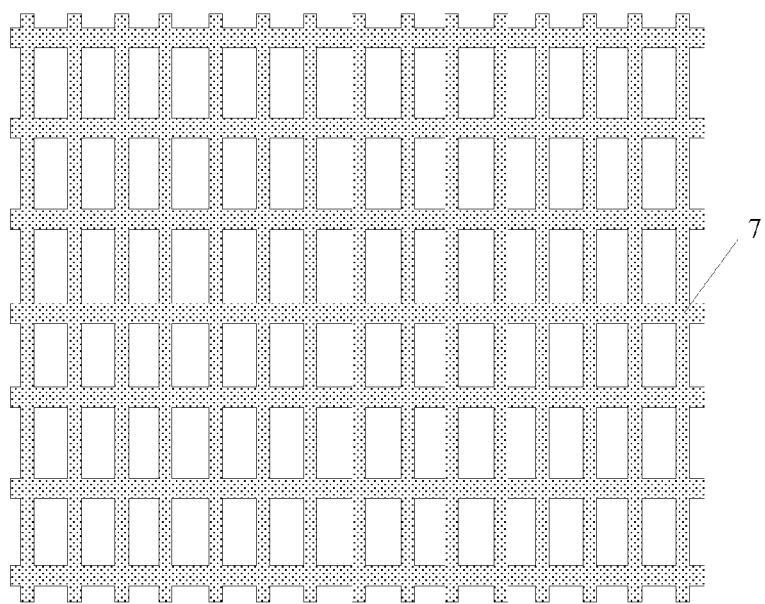
FIG. 2 is a schematic structural diagram of a peep prevention film layer comprised in the peep prevention display in an embodiment of the present disclosure.

Further, as shown in FIG. 2, FIG. 2 is a schematic structural diagram of the peep prevention film layer. The peep prevention film layer 7 has a mesh structure. As an optional implementation, the shape of the meshes of the mesh structure can be any one of rectangle, square, circle and hexagon, and the maximum size of the meshes of the mesh structure is not larger than 100 μm. For example, as the peep prevention film layer shown in FIG. 2, the shape of the meshes of the peep prevention film layer 7 is rectangle, the length of the mesh is around 100 μm, and the width of the mesh is around 20 μm.

More specifically, how the peep prevention display prevents peep according to an embodiment of the present disclosure is described in connection with the schematic cross-sectional view of the peep prevention film layer shown in FIG. 3.

Figure 3:
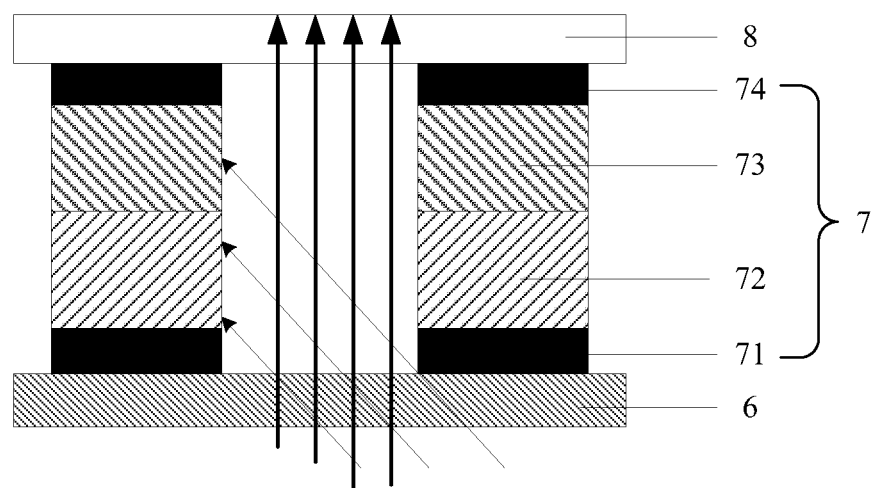
FIG. 3 is a schematic cross-sectional view of the peep prevention film layer comprised in the peep prevention display in an embodiment of the present disclosure.

As shown in FIG. 3, FIG. 3 is a schematic cross-sectional view of the peep prevention film layer in the peep prevention display in an embodiment of the present disclosure. The peep prevention layer 7 further comprises a P electrode lead layer 71, a P type semiconductor layer 72, an N type semiconductor layer 73 and an N electrode lead layer 74. The structures 6 and 8 in FIG. 3 represent the glass substrate for the color filter substrate and the protection glass comprised in the peep prevention display respectively.

As a possible implementation, the forming procedure of the peep prevention film layer 7 according to an embodiment of the present disclosure is briefly described as follows. First, the N electrode lead layer 74, the N type semiconductor layer 73, the P type semiconductor layer 72 and P electrode lead layer 71 are formed on the protection glass 8 in sequence. Then, a pattern of the mesh structure of the peep prevention film layer 7 is formed by etch through one-time patterning process, wherein the formed mesh structure of the peep prevention film layer 7 comprises the shape of the meshes. Then, the protection glass 8 with the peep prevention film layer 7 formed thereon is assembled with the glass substrate 6 of the color filter substrate to form a cell by a cell-assemble process, thus forming the corresponding structures of the peep prevention film layer 7 as shown in FIG. 3.

In particular, when the light emitted from the display emits from the light exit side, as can be known clearly from FIG. 3, the light within the visible angle range would exit from the protection glass 8 through the glass substrate 6 of the color filter substrate and the peep prevention film layer 7 in turn. The light outside the visible angle range would be blocked by the peep prevention film layer 7.

Optionally, the meshes of the mesh structure formed in the peep prevention film layer are arranged corresponding to sub-pixel units or pixel units of the display one to one. In particular, when the meshes of the mesh structure in the peep prevention film layer are arranged corresponding to the sub-pixel units of the display one to one, the peep prevention film layer would restrain the light emitted from each sub-pixel unit, thereby ensuring the display image can only be viewed within the visible angle range.

It can be understood by those skilled in the art that, by taking the peep prevention film layer 7 shown in FIG. 3 as an example, it is possible to control the visible angle of the peep prevention display by adjusting the mesh size of the peep prevention film layer 7 and the thickness of the peep prevention film layer 7. For example, taking the axis direction normal to the display plane as a reference direction, only the user located within the range of ±30° with respect to the reference direction can be allowed to see the displayed image by controlling the peep prevention film layer, which can prevent information leakage due to peep by others without compromising viewing by the user within the visible range.

On the other hand, when side light is incident on the peep prevention film layer 7, because the peep prevention film layer 7 are provided with the P type semiconductor layer 72 and the N type semiconductor layer 73, the P type semiconductor layer 72 and the N type semiconductor layer 73 will generate photo-generated carrier under the illumination of the light, whereby electric potential difference will be generated due to charge accumulation. Then, the photo-generated current can be lead out by the P electrode lead layer 71 and the N electrode lead layer 74, thus achieving the effect of the light blocked by the peep prevention film layer being converted into electrical energy and reused again.

Further, as an optional solution for the peep prevention display provided by an embodiment of the present disclosure, the thickness of the P type semiconductor layer and thickness of the N type semiconductor layer comprised in the peep prevention film layer 7 are 1 μm~10 μm. The thickness of the P electrode lead layer 71 and the thickness of the N electrode lead layer 74 are not larger than 5 μm, and the material of the P electrode lead layer 71 and the material of the N electrode lead layer 74 are any one or several of Aluminum, Copper and Molybdenum.

In conclusion, in the peep prevention display provided by an embodiment of the present disclosure, a peep prevention film layer is provided on the light exit side of the peep prevention display, the peep prevention film layer has a mesh structure, and the meshes of the mesh structure are arranged corresponding to the sub-pixels or the pixels of the display. The peep prevention film layer can be used to block the light so as to achieve the effect of controlling the display angle of view. On the other hand, the peep prevention film layer comprises a P electrode lead layer, a P type semiconductor layer, an N type semiconductor layer and an N electrode lead layer. The peep prevention film layer converts the blocked light into electric energy and outputs the same while blocking the light, thus achieving the effect of self electricity generation.

The above descriptions are only specific embodiments of the present disclosure, but the protection scope of the present disclosure is not limited to this. Modifications or variations can be easily devised by those skilled in the art within the technical scope disclosed by embodiments of the present invention should fall in the protection scope of the present invention. Therefore, the protection scope of the present disclosure should be defined by the claims.

The present application claims the priority of Chinese Patent Application No. 201410032401.5 filed on Jan. 23, 2014, and the entire content of which is incorporated as a part of the present invention by reference.

What is claimed is:

1. A peep prevention display, wherein a peep prevention film layer is arranged on a light exit side of the peep prevention display, and the peep prevention film layer has a mesh structure; the peep prevention film layer comprises: a P electrode lead layer, a P type semiconductor layer, an N type semiconductor layer and an N electrode lead layer.

2. The peep prevention display according to claim 1, wherein meshes of the mesh structure formed in the peep prevention film layer are arranged corresponding to subpixel units or pixel units of the peep prevention display one to one.

3. The peep prevention display according to claim 1, wherein the meshes of the mesh structure has a shape of any one of rectangle, square, circle and hexagon, and a maximum size of the meshes of the mesh structure is not larger than 100 μm.

4. The peep prevention display according to claim 1,
wherein a thickness of the P type semiconductor layer and that of the N type semiconductor layer are 1 μm~10 μm.

5. The peep prevention display according to claim 1, wherein a thickness of the P electrode lead layer and that of the N electrode lead layer are not larger than 5 μm, and material of the P electrode lead layer and that of the N electrode lead layer are any one or several of Aluminum, Copper and Molybdenum.

6. The peep prevention display according to claim 1, wherein a protection glass is arranged at the light exit side of the peep prevention film layer of the peep prevention display.

\* \* \* \* \*